United States Patent
Komine et al.

(10) Patent No.: US 7,906,258 B2
(45) Date of Patent: Mar. 15, 2011

(54) PHOTOMASK, PHOTOMASK SUPERIMPOSITION CORRECTING METHOD, AND MANUFACTURING METHOD OF SEMICONDUCTOR DEVICE

(75) Inventors: Nobuhiro Komine, Yokkaichi (JP);
Kazutaka Ishigo, Yokohama (JP);
Noriaki Sasaki, Yokohama (JP);
Masayuki Hatano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 556 days.

(21) Appl. No.: 12/047,516

(22) Filed: Mar. 13, 2008

(65) Prior Publication Data
US 2008/0225254 A1    Sep. 18, 2008

(30) Foreign Application Priority Data
Mar. 14, 2007    (JP) ................. 2007-065516

(51) Int. Cl.
*G03F 1/00*    (2006.01)
*G03C 5/00*    (2006.01)
*H01L 21/00*    (2006.01)
(52) U.S. Cl. ............... 430/5; 430/22; 430/311
(58) Field of Classification Search ............. 430/5, 22, 430/30, 311, 312, 313
See application file for complete search history.

(56) References Cited

U.S. PATENT DOCUMENTS
6,855,997 B2 *   2/2005   Suwa ................ 430/5

FOREIGN PATENT DOCUMENTS
| JP | 9-102457 | 4/1997 |
| JP | 11-251218 | 9/1999 |
| JP | 2002-64055 | 2/2002 |
| JP | 3371852 | 11/2002 |

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

In a photomask in which a device pattern, an alignment mark and a superimposition inspection mark are formed on a light transmitting base, each of the alignment mark and the superimposition inspection mark includes a main mark portion, and first and second auxiliary pattern portions. The main mark portion is constituted of one of a space pattern and a line pattern, the pattern having a linear width to be resolved on a photosensitive film formed on a semiconductor wafer, and each of the first and second auxiliary pattern portions includes an auxiliary pattern constituted of one of a repeated pattern of a space pattern and a repeated pattern of a line pattern, the repeated pattern having a linear width not to be resolved on the photosensitive film. The pitch of the repeated pattern is equal to the minimum pitch of the device pattern.

16 Claims, 19 Drawing Sheets

(Projection optical system not shown)

Photomask (reticle)

Mark

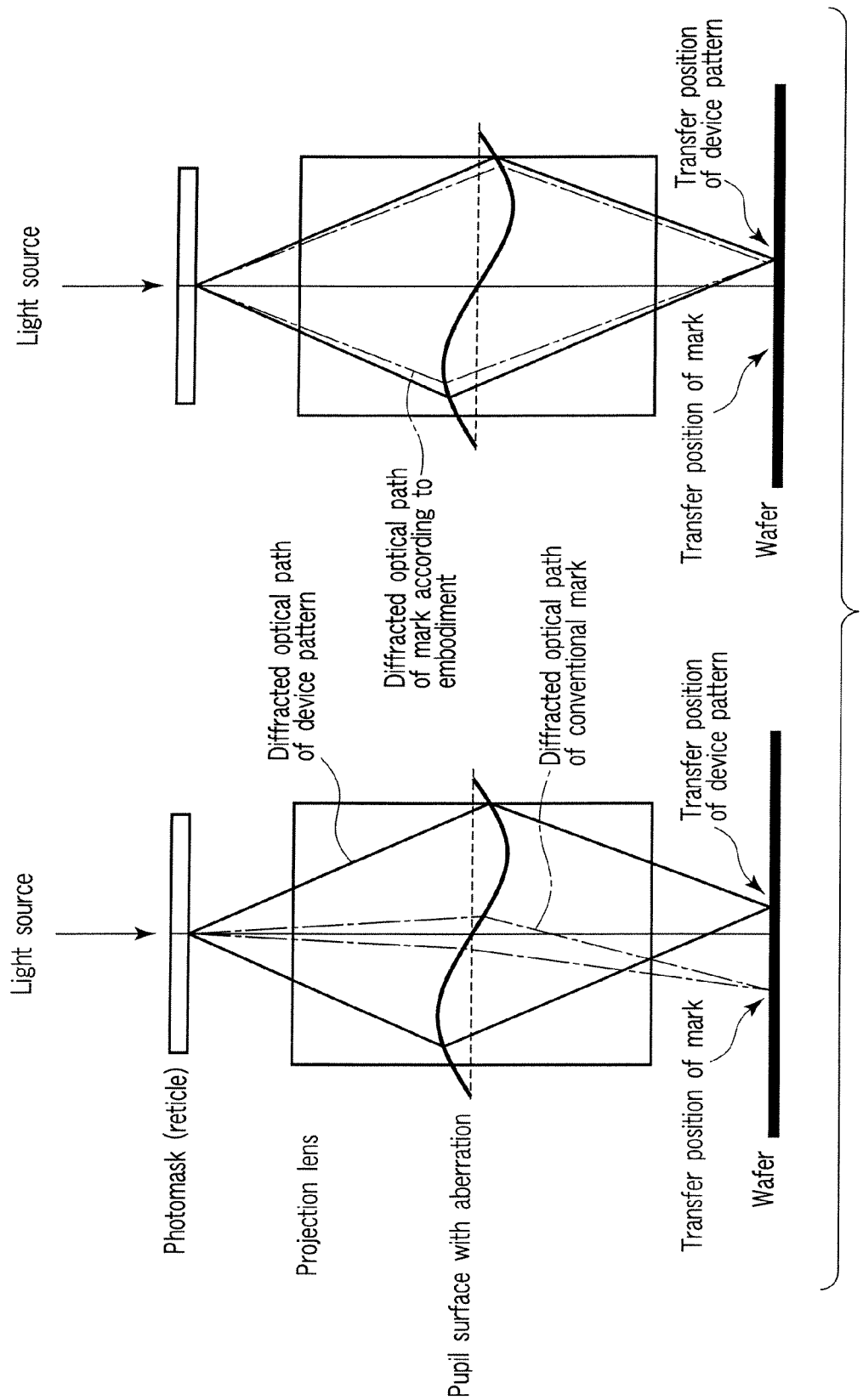
F I G. 5

(Space pattern)
Superimposition inspection mark (Line pattern)
Superimposition inspection mark (Space pattern)
Alignment mark (Line pattern)
Alignment mark

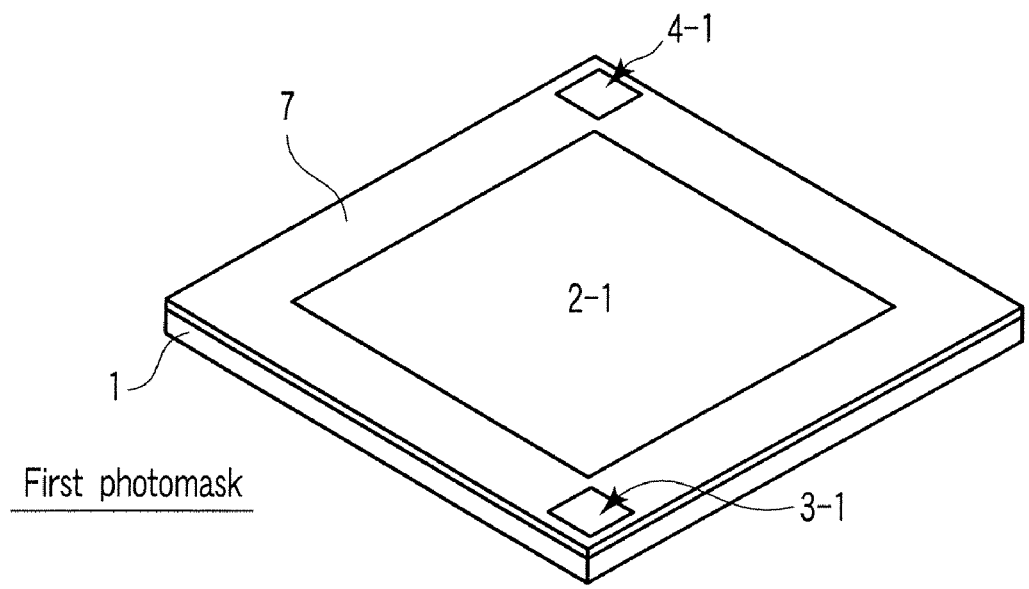
F I G. 11
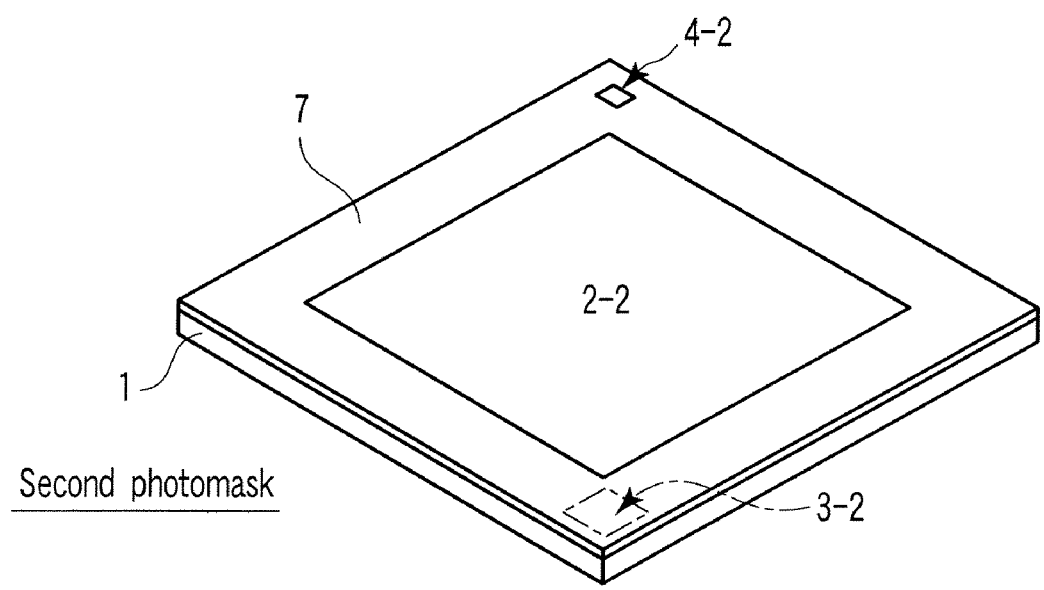
F I G. 12

Superimposition inspection mark 4-1 formed on first photomask

Superimposition inspection mark 4-2 formed on second photomask

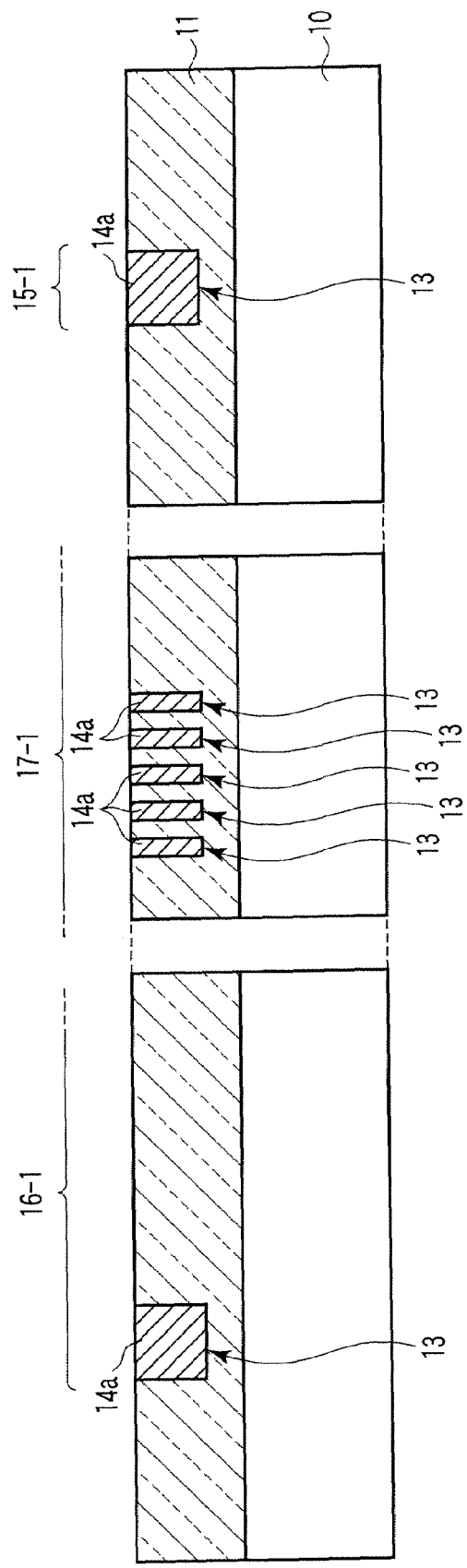
F I G. 18

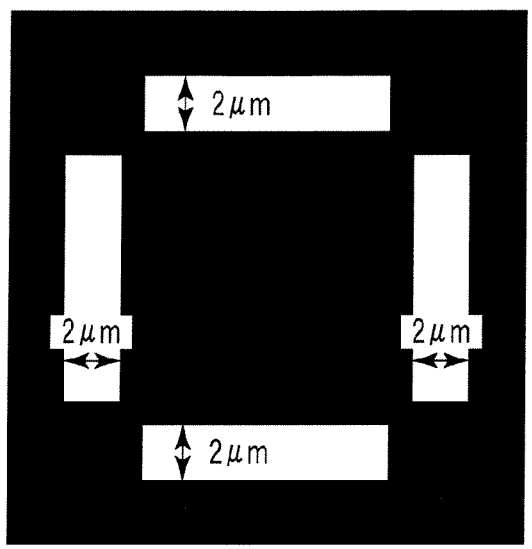
Conventional superimposition inspection mark
F I G. 26
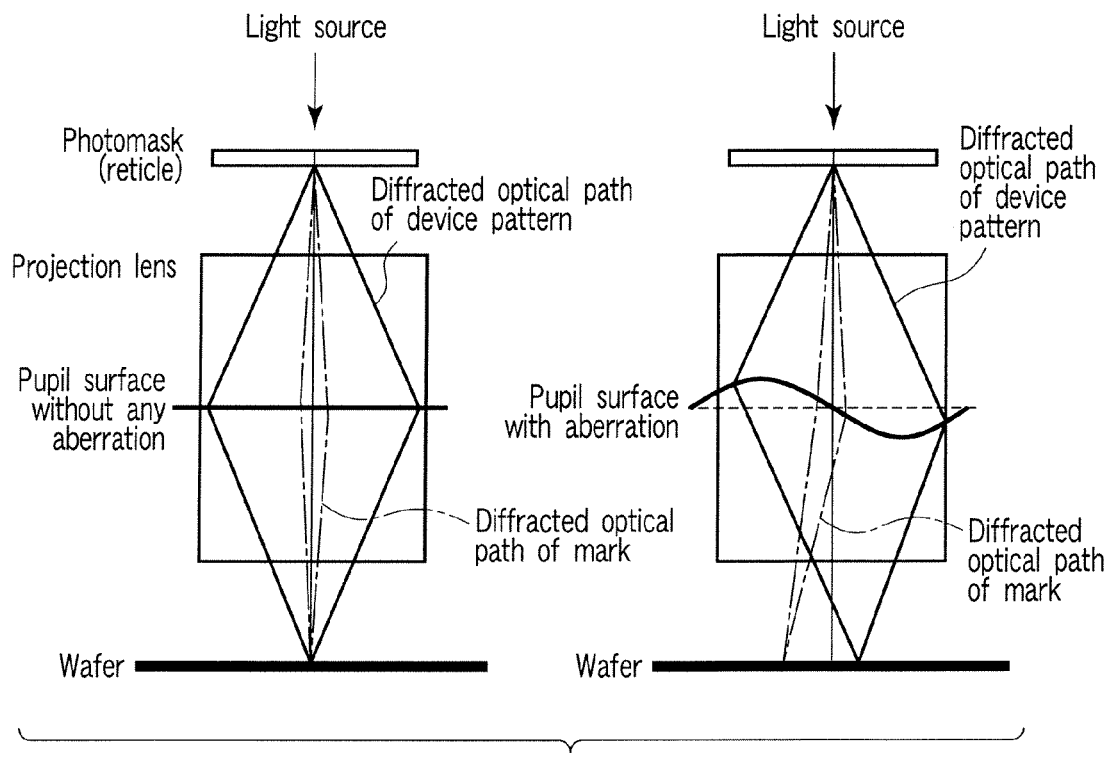
F I G. 27

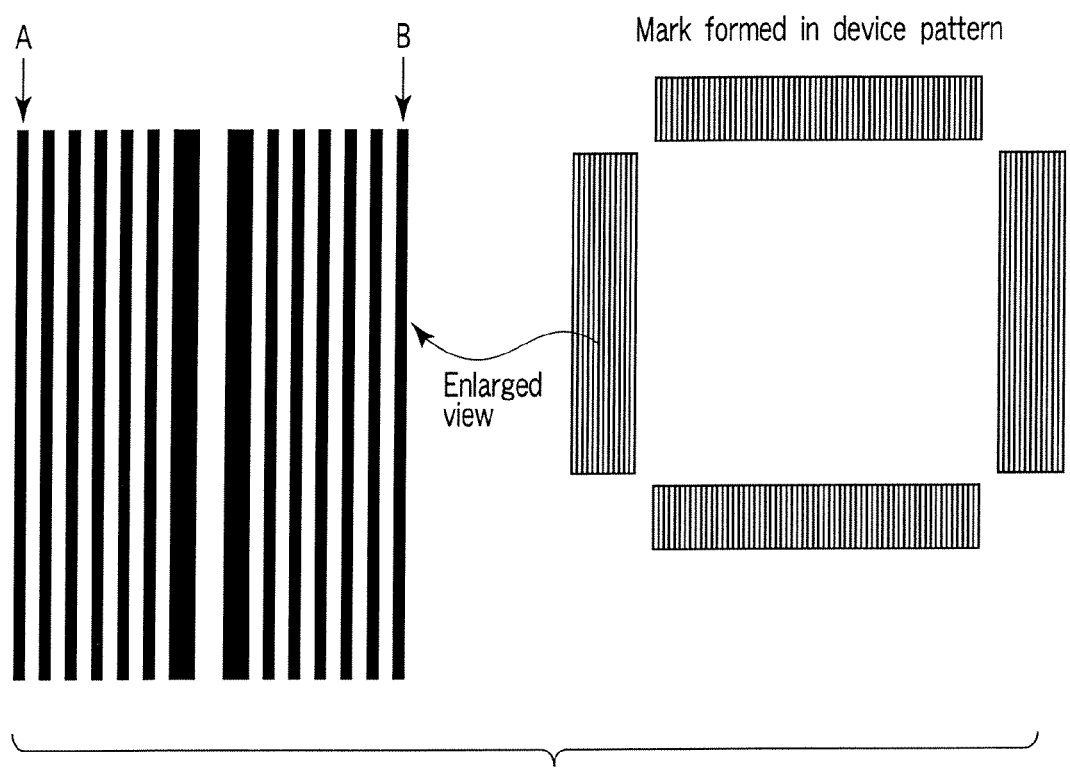
F I G. 28

PHOTOMASK, PHOTOMASK SUPERIMPOSITION CORRECTING METHOD, AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2007-065516, filed Mar. 14, 2007, the entire contents of which are incorporated herein by reference.

BACKGROUND OF THE INVENTION

1. Field of the Invention

The present invention relates to a photomask (a reticle) for use in a lithography step of a semiconductor device, a photomask superimposition correcting method, and a manufacturing method of a semiconductor device using the photomask.

2. Description of the Related Art

A photomask for use in a lithography step of a semiconductor device includes an alignment mark and a superimposition inspection mark.

The alignment mark is used for alignment in correctly superimposing, on a device pattern (a circuit pattern) already formed on a semiconductor substrate, a device pattern which is formed on the photomask and which is to be next formed on the substrate to expose the pattern. The alignment is performed in a state in which the photomask is set on an exposure apparatus.

The superimposition inspection mark is used in superimposition inspection to inspect whether or not the device pattern formed by the exposure has been exposed at a correct position. The superimposition inspection is performed using a superimposition inspection apparatus.

These alignment mark and superimposition inspection mark are usually larger than the device pattern, and have different pattern shapes so that the marks can easily be detected by the exposure apparatus and the superimposition inspection apparatus, respectively.

In recent years, with miniaturization of the device pattern of the semiconductor device, the sizes and the pattern shapes of the alignment mark and the superimposition inspection mark have been greatly different from those of the device pattern. Therefore, an alignment error between these patterns also increases.

Heretofore, as means for eliminating the alignment error produced by the large difference in size and pattern shape, there have been suggested a method for reducing the length of the alignment mark to a length close to that of a circuit pattern shape (e.g., Jpn. Pat. Appln. KOKAI Publication No. 9-102457 [Patent Document 1]) and a method for forming the mark by use of a part of the device pattern, or a similar pattern (e.g., Jpn. Pat. Appln. KOKAI Publication No. 2002-64055 [Patent Document 2]).

However, in these methods, a certain effect can be anticipated with respect to a difference of optimum exposure, but deviation of a transfer position due to an aberration of a projection lens, and an alignment error due to a measurement error caused by pattern asymmetry cannot be eliminated, and lowering of a superimposition inspection precision due to the error cannot be suppressed.

BRIEF SUMMARY OF THE INVENTION

According to a first aspect of the present invention, there is provided a photomask comprising:

a light transmitting base having a light blocking film on one surface thereof;

a device pattern which is formed of a pattern of a light transmitting portion and a light blocking portion in accordance with the presence and absence of the light blocking film on the light transmitting base and which becomes a circuit pattern of a semiconductor integrated circuit device; and at least one of an alignment mark which is formed of a pattern of a light transmitting portion and a light blocking portion in accordance with the presence and absence of the light blocking film on the light transmitting base and which is utilized for alignment of the photomask during exposure, and a superimposition inspection mark which is formed of a pattern of a light transmitting portion and a light blocking portion in accordance with the presence and absence of the light blocking film on the light transmitting base and which is utilized for superimposition inspection to inspect whether or not the device pattern has been exposed at a correct position, wherein each of the alignment mark and the superimposition inspection mark includes a main mark portion, and first and second auxiliary pattern portions formed along two opposite side ends of the main mark portion, the main mark portion is constituted of one of a space pattern in which a hole is made through the light blocking film and a line pattern in which the light blocking film is left, the pattern having a linear width to be resolved on a photosensitive film formed on a semiconductor wafer, each of the first and second auxiliary pattern portions includes an auxiliary pattern, which is constituted of one of a repeated pattern of a space pattern in which a hole is made through the light blocking film and a repeated pattern of a line pattern in which the light blocking film is left, the repeated pattern having a linear width not to be resolved on the photosensitive film, and the pitch of the repeated pattern is equal to the minimum pitch of the device pattern.

According to a second aspect of the present invention, there is provided a superimposition correction method of a photomask, comprising:

preparing a first photomask including a first device pattern which becomes a circuit pattern of a semiconductor integrated circuit device, a first alignment mark constituted of the alignment mark according to claim 1, and a first superimposition inspection mark constituted of the superimposition inspection mark according to claim 1;

preparing a second photomask including a second device pattern which becomes a circuit pattern of the semiconductor integrated circuit device and which is superimposed on the first device pattern, and a second superimposition inspection mark constituted of the superimposition inspection mark according to claim 1;

forming, on a semiconductor wafer by use of the first photomask, a first in-wafer device pattern corresponding to the first device pattern, a first in-wafer alignment mark corresponding to the first alignment mark, and a first in-wafer superimposition inspection mark corresponding to the first superimposition inspection mark;

forming, on the semiconductor wafer, a second in-wafer device pattern corresponding to the second device pattern, and a second in-wafer superimposition inspection mark corresponding to the second superimposition inspection mark, in a state in which the second photomask is aligned on the semiconductor wafer by use of the first in-wafer alignment mark; and inspecting a relative positional deviation between the first in-wafer superimposition inspection mark and the second in-wafer superimposition inspection mark to correct, by use of a result of this inspection, an exposure position in a lithography step in which the first and second photomasks are used.

According to a third aspect of the present invention, there is provided a manufacturing method of a semiconductor device, comprising:

preparing a first photomask including a first device pattern which becomes a circuit pattern of a semiconductor integrated circuit device, a first alignment mark constituted of the alignment mark according to claim 1, and a first superimposition inspection mark constituted of the superimposition inspection mark according to claim 1;

preparing a second photomask including a second device pattern which becomes a circuit pattern of the semiconductor integrated circuit device and which is superimposed on the first device pattern, and a second superimposition inspection mark constituted of the superimposition inspection mark according to claim 1;

forming, on a semiconductor wafer by use of the first photomask, a first in-wafer device pattern corresponding to the first device pattern, a first in-wafer alignment mark corresponding to the first alignment mark, and a first in-wafer superimposition inspection mark corresponding to the first superimposition inspection mark; and forming, on the semiconductor wafer, a second in-wafer device pattern corresponding to the second device pattern, and a second in-wafer superimposition inspection mark corresponding to the second superimposition inspection mark, in a state in which the second photomask is aligned on the semiconductor wafer by use of the first in-wafer alignment mark.

BRIEF DESCRIPTION OF THE SEVERAL VIEWS OF THE DRAWING

FIG. 5 is a diagram showing a path of diffracted light;

FIG. 11 is a perspective view showing one example of a first photomask according to the embodiment of the present invention;

FIG. 12 is a perspective view showing one example of a second photomask according to the embodiment of the present invention;

FIG. 18 is a sectional view in a step of the manufacturing method of the semiconductor device using the photomask according to the embodiment of the present invention;

FIG. 26 is a diagram showing a typical superimposition inspection mark;

FIG. 27 is a diagram showing a path of diffracted light; and

FIG. 28 is a diagram showing another superimposition inspection mark.

DETAILED DESCRIPTION OF THE INVENTION

Figure 1:
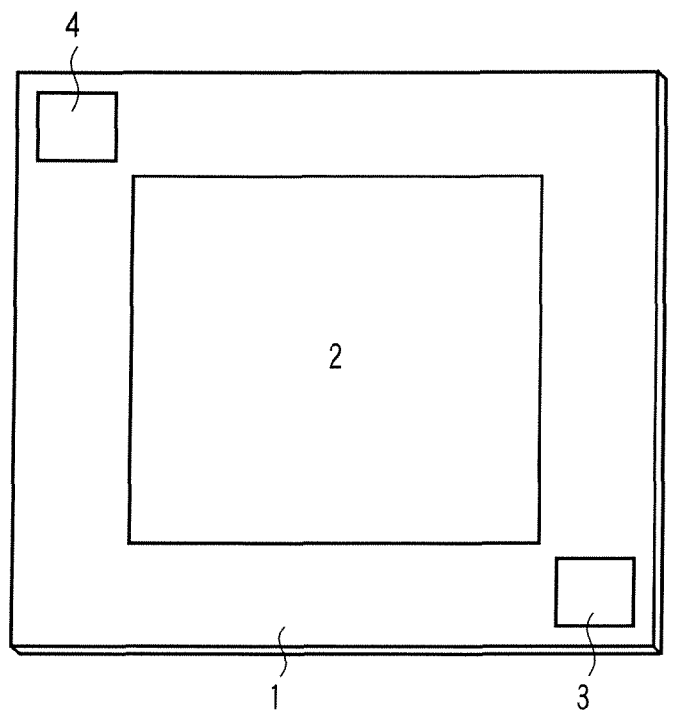
FIG. 1 is a plan view showing one example of a photomask according to one embodiment of the present invention.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

Prior to description of the best mode for carrying out the present invention, situations of the existing marks will be described. In this description, among the marks, a superimposition inspection mark will be described.

FIG. 26 shows a typical superimposition inspection mark, and individual patterns have a linear width of about 2 µm. On the other hand, with miniaturization, a pattern linear width of the existing device pattern becomes as fine as about 3% of the pattern linear width of the inspection mark. Therefore, as shown in FIG. 27, when a projection lens of an exposure apparatus has an aberration, the path (hereinafter referred to as the diffracted optical path) of diffracted light produced by the pattern differs, and a difference is produced between transfer positions. As a result, the positional deviation of the device pattern cannot be precisely estimated even using the superimposition inspection mark. Actually, a positional deviation close to 5 nm is produced between the device pattern and the superimposition inspection mark. This also applies to alignment using an alignment mark. This divergence is the difference in optimum exposure produced by the difference in the pattern linear width as described above. Specifically, the optimum exposure with respect to the device pattern tends to be excessively large compared with the optimum exposure of the alignment mark or the superimposition inspection mark, and this divergence tends to increase.

To solve this problem, Patent Documents 1 and 2 are suggested. For example, as shown in FIG. 28, a mark is formed of a device pattern itself, or the mark is formed using a line-and-space pattern close to the device pattern. However, when the mark is formed of the device pattern itself or the mark is formed using the line-and-space pattern close to the device pattern, pattern asymmetry (A−B≠0) due to the aberration of the projection lens is produced at the ends of the mark, and a measurement error due to this pattern asymmetry is produced, so that the alignment precision and superimposition inspection precision decrease.

One embodiment of the present invention will hereinafter be described with reference to the drawings. In the following description, parts common to all the drawings are denoted with the same reference numerals.

FIG. 1 is a plan view showing one example of a photomask (a reticle) according to the embodiment of the present invention.

As shown in FIG. 1, the photomask according to the embodiment includes a light transmitting base 1 having a light blocking film on one surface thereof, and a device pattern 2, an alignment mark 3 and a superimposition inspection mark 4 formed on the light transmitting base 1.

The device pattern 2 is formed of a pattern of a light transmitting portion and a light blocking portion in accordance with the presence and absence of the light blocking film to constitute a circuit pattern of a semiconductor integrated circuit device. The device pattern 2 is formed in the center of the base 1.

The alignment mark 3 is formed of a pattern of a light transmitting portion and a light blocking portion in accordance with the presence and absence of the light blocking film in the same manner as in the device pattern 2, and the mark is used for alignment of the photomask during exposure.

The superimposition inspection mark 4 is formed of a pattern of a light transmitting portion and a light blocking portion in accordance with the presence and absence of the light blocking film in the same manner as in the device pattern 2, and the mark is used in superimposition inspection to inspect whether or not the device pattern 2 has been exposed at a correct position.

The alignment mark 3 and the superimposition inspection mark 4 are formed in a peripheral portion of the base 1 in the present example.

(Mark)

Figure 2:
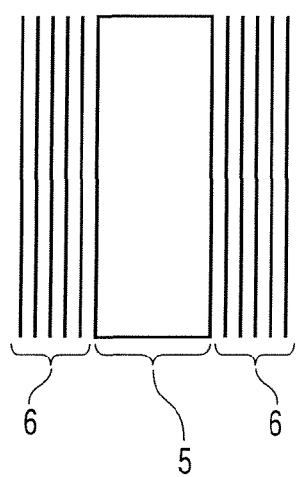
FIG. 2 is a plan view showing a basic constitution of a mark formed on the photomask.

FIG. 2 is a plan view showing a basic constitution of a mark formed on the photomask according to the embodiment of the present invention.

The alignment mark 3 and the superimposition inspection mark 4 of the present example include the mark shown in FIG. 2 as the basic constitution. This mark includes a main mark portion 5, and first and second auxiliary pattern portions 6 formed along two opposite side ends of this main mark portion 5.

The main mark portion 5 is constituted of one of a space pattern in which a hole is made through the light blocking film and a line pattern in which the light blocking film is left. The space pattern or the line pattern constituting the main mark portion 5 has a linear width to be resolved on a photosensitive film formed on a semiconductor wafer. The main mark portion 5 may be a mark which has heretofore been used.

Figure 3:
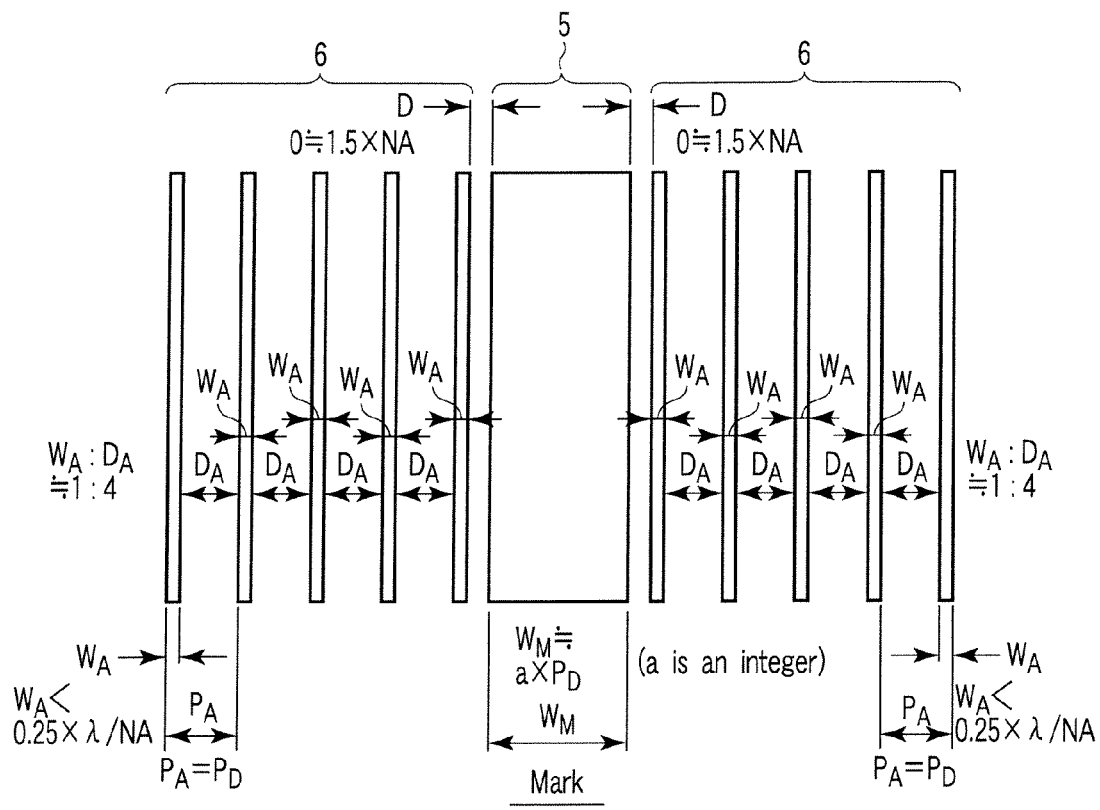
FIG. 3 is an enlarged view of the mark formed on the photomask.

Each of the first and second auxiliary pattern portions 6 includes an auxiliary pattern. The auxiliary pattern is constituted of one of a repeated pattern of the space pattern in which the hole is made through the light blocking film and a repeated pattern of the line pattern in which the light blocking film is left. The repeated pattern of the space pattern constituting the auxiliary pattern or the line pattern in which the light blocking film is left has a linear width not to be resolved on the photosensitive film formed on the semiconductor wafer. Each auxiliary pattern portion 6 of the present example is obtained by arranging five of thin line-and-space patterns not to be resolved on the semiconductor wafer. FIG. 3 shows an enlarged view of the mark, and FIG. 4 shows an enlarged view of a device pattern.

Figure 4:
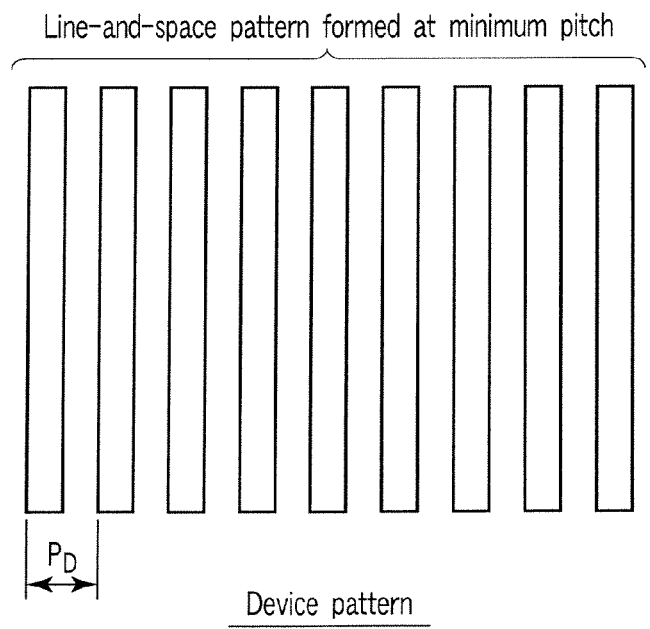
FIG. 4 is an enlarged view of a device pattern formed on the photomask.

As shown in FIGS. 3 and 4, the linear width (linear width of the auxiliary pattern) $W_A$ of the line-and-space pattern is less than $0.25\lambda/NA$, in which NA is the numeric aperture of light to be used, and $\lambda$ is the wavelength of exposure light of an exposure apparatus to be used. The pitch (pitch of the auxiliary pattern) $P_A$ of the line-and-space pattern is equal to the pitch (minimum pitch of the device pattern) $P_D$ of the line-and-space pattern included in the device pattern and formed at the minimum pitch. The width $W_M$ of a main mark is an integer multiple of the minimum pitch $P_D$ of the device pattern, and substantially "a" times the minimum pitch $P_A$ in the present example. Furthermore, when the linear width of the auxiliary pattern is $W_A$, the auxiliary pattern is repeatedly arranged from a start position of $1.5 \times W_A$ from an end of the main mark, substantially $1.5 \times W_A$ in the present example at such a pitch that $W_A:D_A$ between the linear width $W_A$ of the auxiliary pattern and a distance $D_A$ from another auxiliary pattern adjacent to the above auxiliary pattern is greater than at least 1:1. In the present example, $W_A:D_A$ is substantially 1:4. In short, a space $D_A$ between the auxiliary patterns is greater than the linear width $W_A$ of the auxiliary pattern.

Such a mark is used in the photomask, whereby during exposure, a diffracted optical path produced by the mark can be brought remarkably close to the diffracted optical path of the device pattern. This is actually shown in FIG. 5.

Each solid line in FIG. 5 shows the diffracted optical path of the device pattern. Furthermore, the one-dot chain line of the left drawing shows the diffracted optical path produced by a conventional mark, and the one-dot chain line of the right drawing shows the diffracted optical path produced by the mark according to the present embodiment. As is apparent from FIG. 5, compared with the conventional mark, the mark according to the present embodiment has a very high correlation between the mark and the diffracted optical path of the device pattern. When the diffracted optical paths are the same or substantially the same, it is indicated that the mark and the pattern are equally or substantially equally influenced by the aberration of the projection lens. As a result, a difference between a transfer position of the mark according to the present embodiment and a transfer position of the device pattern is greater than that between a transfer position of the conventional mark and the transfer position of the device pattern. This is shown with specific numeric values in FIG. 6.

Figure 6:
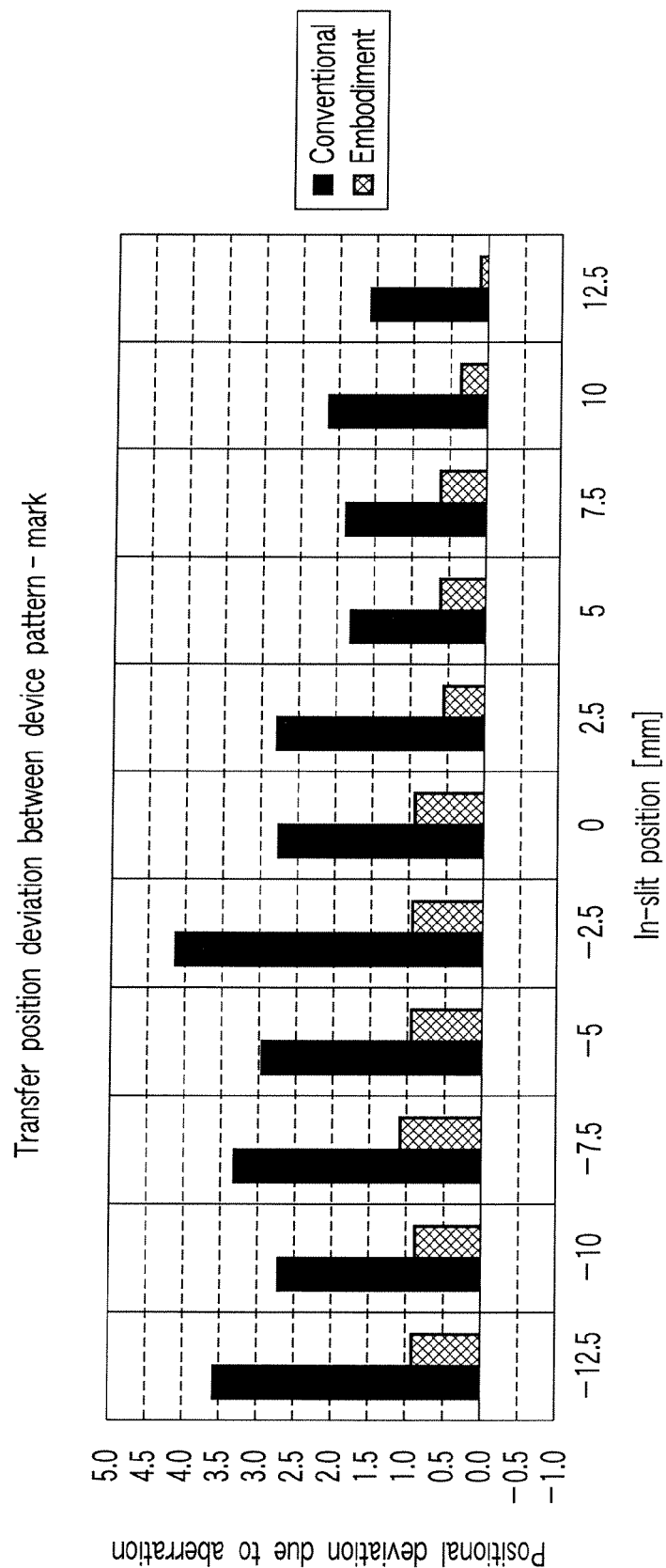
FIG. 6 is a diagram showing a transfer position deviation.

As shown in FIG. 6, a deviation between the transfer positions of the device pattern and the mark can be reduced. As a result, as compared with a conventional technique, superimposition deviations can precisely be inspected. For the same reason, with regard to the alignment mark, a deviation between the transfer positions of the device pattern and the mark can be reduced, and alignment can precisely be performed.

(Superimposition Inspection Mark)

Next, examples of the superimposition inspection mark will be described.

Figure 7:
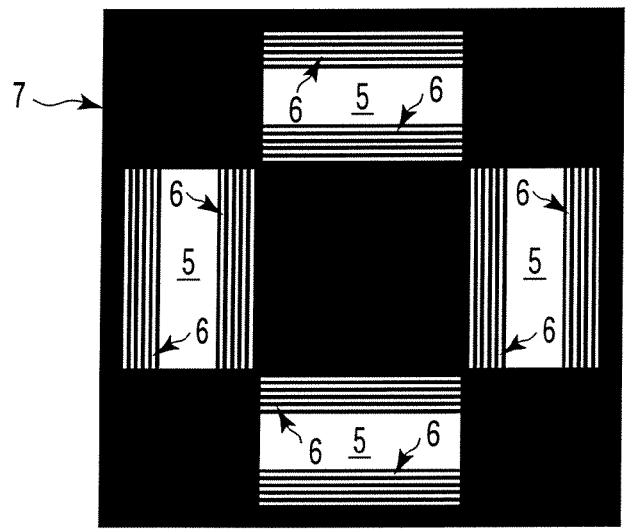
FIG. 7 is a plan view showing a first example of a superimposition inspection mark obtained according to the embodiment of the present invention.

FIG. 7 is a plan view showing a first example of the superimposition inspection mark obtained according to the embodiment of the present invention.

As shown in FIG. 7, the superimposition inspection mark according to the first example is formed as so-called space patterns obtained by making holes in a light blocking film 7 formed on a light transmitting substrate of a photomask. The superimposition inspection mark is obtained by arranging four marks each including a main mark portion 5 and auxiliary pattern portions 6 on opposite sides of the main mark portion along four sides of a rectangle. In the present example, the superimposition inspection mark is obtained by arranging four marks along four sides of a square.

According to the superimposition inspection mark of the first example, the auxiliary pattern portions 6 are provided on the opposite sides of each main mark portion 5 as described above, so that a deviation difference between a transfer position of a device pattern on a semiconductor wafer and a transfer position of the superimposition inspection mark on the semiconductor wafer can be reduced. The superimposition inspection mark is formed on the semiconductor wafer by use of such superimposition inspection marks, and superimposition inspection is performed using the formed superimposition inspection mark, whereby the superimposition inspection can precisely be made.

Figure 8:
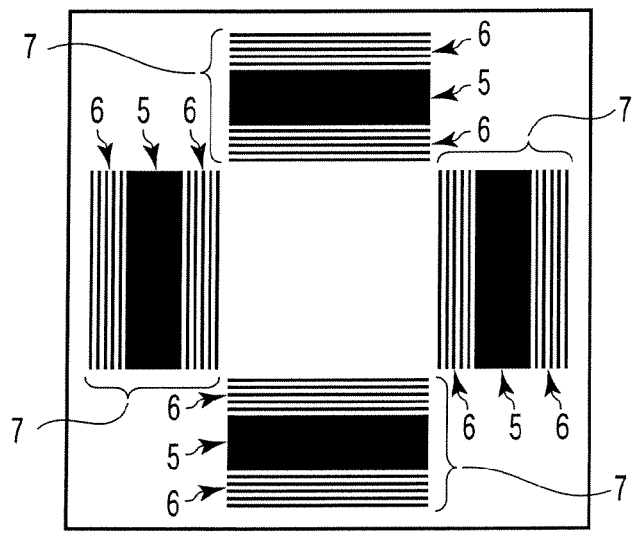
FIG. 8 is a plan view showing a second example of the superimposition inspection mark obtained according to the embodiment of the present invention.

FIG. 8 is a plan view showing a second example of the superimposition inspection mark obtained according to the embodiment of the present invention.

As shown in FIG. 8, the superimposition inspection mark according to the second example is formed as a so-called line pattern obtained by leaving light blocking films 7 on a light transmitting substrate of a photomask. Even in the second example, in the same manner as in the first example, the superimposition inspection mark is obtained by arranging four marks each including a main mark portion 5 and auxiliary pattern portions 6 on opposite sides of the main mark portion along four sides of a rectangle. In the present example, the superimposition inspection mark is obtained by arranging four marks along four sides of a square.

According to the superimposition inspection mark of the second example, in the same manner as in the first embodiment, the auxiliary pattern portions 6 are provided on the opposite sides of each main mark portion 5, so that an effect similar to that of the first example of the superimposition inspection mark can be obtained.

(Alignment Mark)

Next, examples of the alignment mark will be described.

Figure 9:
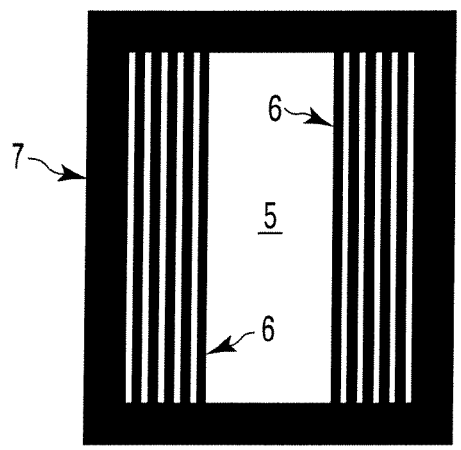
FIG. 9 is a plan view showing a first example of an alignment mark obtained according to the embodiment of the present invention.

FIG. 9 is a plan view showing a first example of an alignment mark obtained according to the embodiment of the present invention.

As shown in FIG. 9, the alignment mark according to the first example is formed as a space pattern in the same manner as in the first example of the superimposition inspection mark. The alignment mark is a mark including a main mark portion 5 and auxiliary pattern portions 6 on opposite sides of the main mark portion.

According to the alignment mark of the first example, the above auxiliary pattern portions 6 are provided on the opposite sides of the main mark portion 5, so that a deviation difference between a transfer position of a device pattern on a semiconductor wafer and a transfer position of the alignment mark on the semiconductor wafer can be reduced. The alignment mark is formed on the semiconductor wafer by use of such an alignment mark, and alignment is performed using the formed alignment mark, whereby the alignment can precisely be performed.

Figure 10:
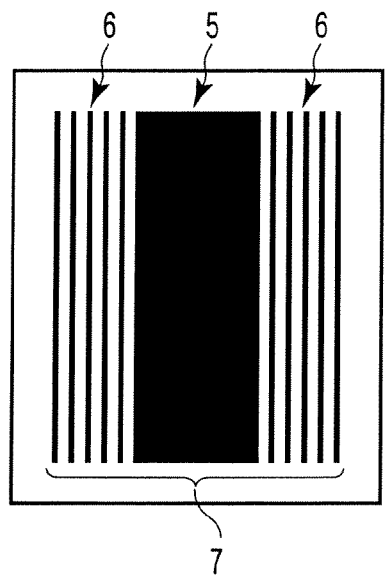
FIG. 10 is a plan view showing a second example of the alignment mark obtained according to the embodiment of the present invention.

FIG. 10 is a plan view showing a second example of the alignment mark obtained according to the embodiment of the present invention.

As shown in FIG. 10, the alignment mark according to the second example is formed as a line pattern in the same manner as in the second example of the superimposition inspection mark. The alignment mark is a mark including a main mark portion 5 and auxiliary pattern portions 6 on opposite sides of the main mark portion.

According to the alignment mark of the second example, in the same manner as in the first example, the above auxiliary pattern portions 6 are provided on the opposite sides of the main mark portion 5, so that an effect similar to that of the first example of the alignment mark can be obtained.

(Manufacturing Method of Semiconductor Device)

Next, an example of a manufacturing method of a semiconductor device by use of the photomask according to the embodiment of the present invention will be described.

FIG. 11 is a perspective view showing a first photomask, and FIG. 12 is a perspective view showing a second photomask.

Figure 13:
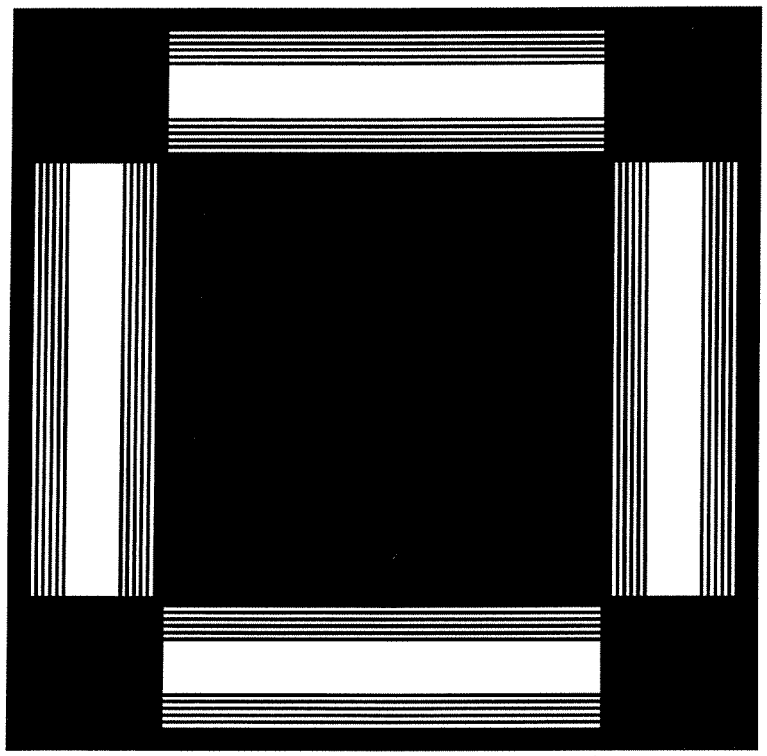
FIG. 13 is a plan view showing a superimposition inspection mark formed on the first photomask.

First, the first and second photomasks are prepared. As shown in FIG. 11, the first photomask includes a first device pattern 2-1, a first alignment mark 3-1, and a first superimposition inspection mark 4-1. FIG. 13 shows an example of the first superimposition inspection mark 4-1. The first superimposition inspection mark 4-1 is similar to the mark shown in FIG. 7, and includes main mark portions 5 and auxiliary pattern portions 6 formed on opposite sides of each main mark portion. The first alignment mark 3-1 is not especially shown, but may be, for example, the mark shown in FIG. 9.

Figure 14:
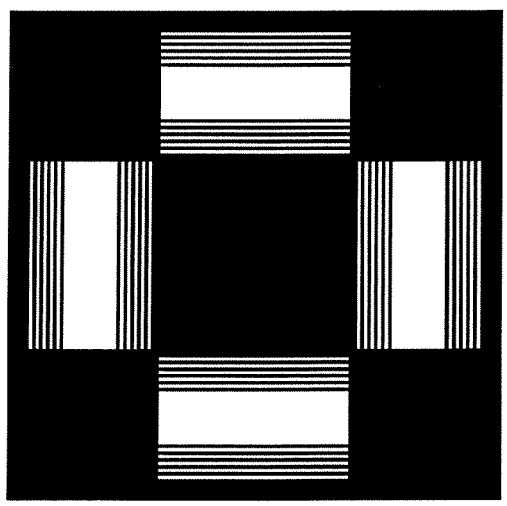
FIG. 14 is a plan view showing a superimposition inspection mark formed on the second photomask.

Similarly, as shown in FIG. 12, the second photomask includes a second device pattern 2-2, a second alignment mark 3-2 and a second superimposition inspection mark 4-2. FIG. 14 shows an example of the second superimposition inspection mark 4-2. The second superimposition inspection mark 4-2 also includes main mark portions 5 and auxiliary pattern portions 6 formed on opposite sides of each main mark portion in the same manner as in the first superimposition inspection mark 4-1. However, the size of the second superimposition inspection mark 4-2 is different from that of the first superimposition inspection mark 4-1. This is because a superimposition inspection apparatus can easily measure the relative positional deviation between a transfer position of the superimposition inspection mark 4-1 and a transfer position of the superimposition inspection mark 4-2. In the present example, the second superimposition inspection mark 4-2 is smaller than the first superimposition inspection mark 4-1. The second superimposition inspection mark 4-2 is transferred into a rectangular region surrounded by the main mark portions 5 of the first superimposition inspection mark 4-1, that is, into a square region in the present example. The second alignment mark 3-2 is not especially shown, but may be, for example, the mark shown in FIG. 9. The second alignment mark 3-2 may be provided if necessary, and does not have to be provided if unnecessary.

FIGS. 15 to 22 are sectional views showing main steps of one example of a manufacturing method of a semiconductor device using the photomask according to the embodiment of the present invention. It is to be noted that in the present example, one example of the manufacturing method of the semiconductor device using the photomask according to the embodiment of the present invention is described, so that description of detailed steps, for example, a step of forming a semiconductor element such as a transistor is omitted.

Figure 15:
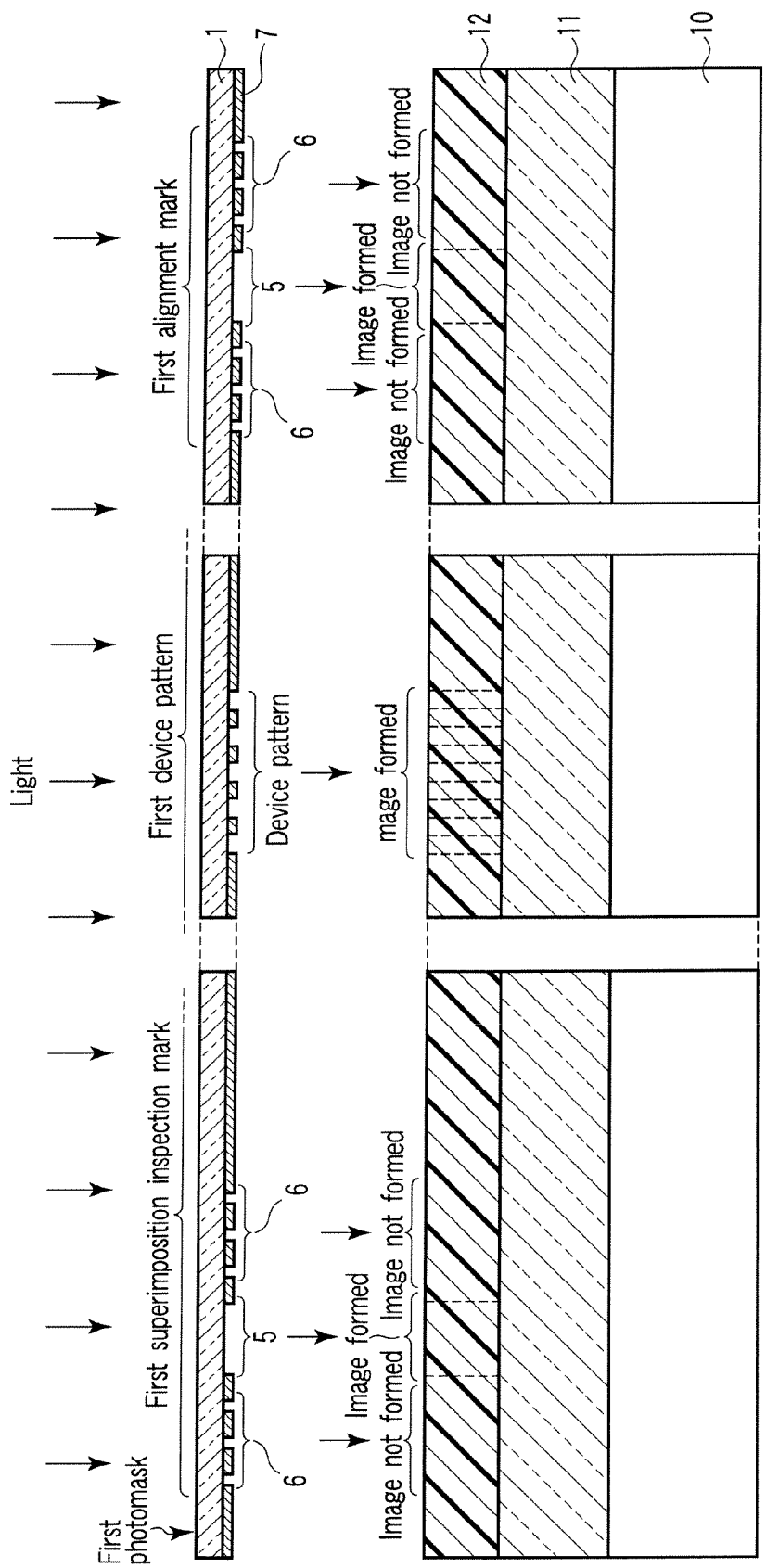
FIG. 15 is a sectional view in a step of a manufacturing method of a semiconductor device using the photomask according to the embodiment of the present invention.

First, as shown in FIG. 15, a first interlayer insulating film 11 is formed on a semiconductor substrate 10. One example of the semiconductor substrate 10 is a silicon substrate, and one example of the first interlayer insulating film 11 is a silicon dioxide film. Then, a first photoresist film 12 is formed on the first interlayer insulating film 11. One example of the first photoresist film 12 is a positive photoresist film. Subsequently, the first photomask shown in FIG. 11 is moved above the semiconductor substrate 10, and the first photoresist film 12 is irradiated with light via the first photomask to expose the first photoresist film 12. At this time, a device pattern and main mark portions 5 formed on the first photomask are formed into images on the first photoresist film 12, but auxiliary pattern portions 6 are not formed into images on the first photoresist film 12.

Figure 16:
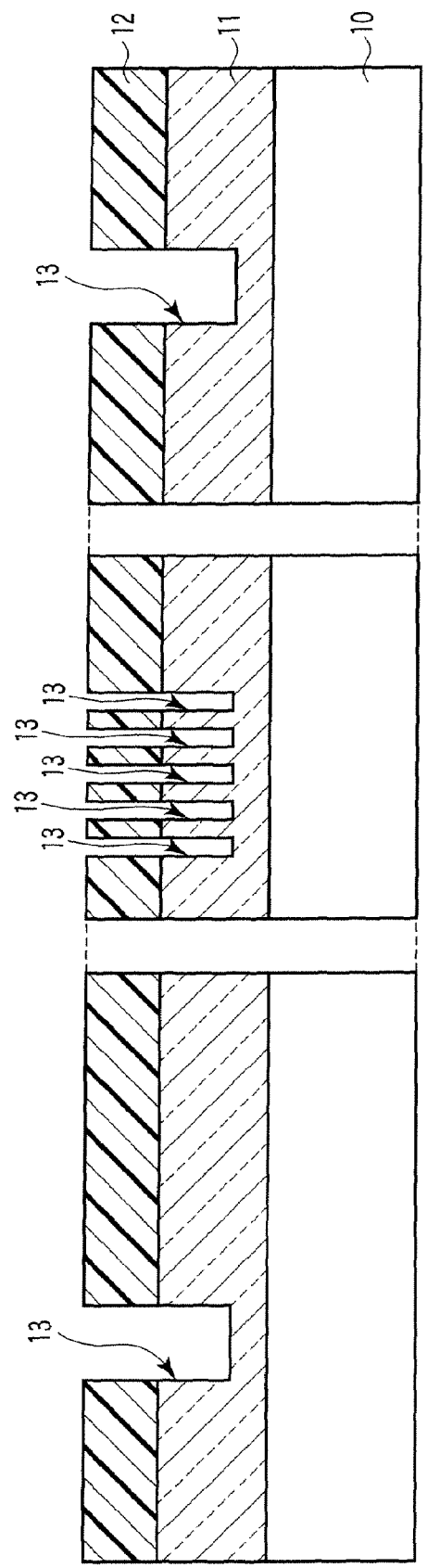
FIG. 16 is a sectional view in a step of the manufacturing method of the semiconductor device using the photomask according to the embodiment of the present invention.

Subsequently, as shown in FIG. 16, the first photoresist film 12 is developed. Then, the first interlayer insulating film 11 is etched using the developed first photoresist film 12 as a mask to form grooves 13 in the first interlayer insulating film 11. These grooves 13 are used as, for example, grooves for damascene wiring in a device pattern part.

Figure 17:
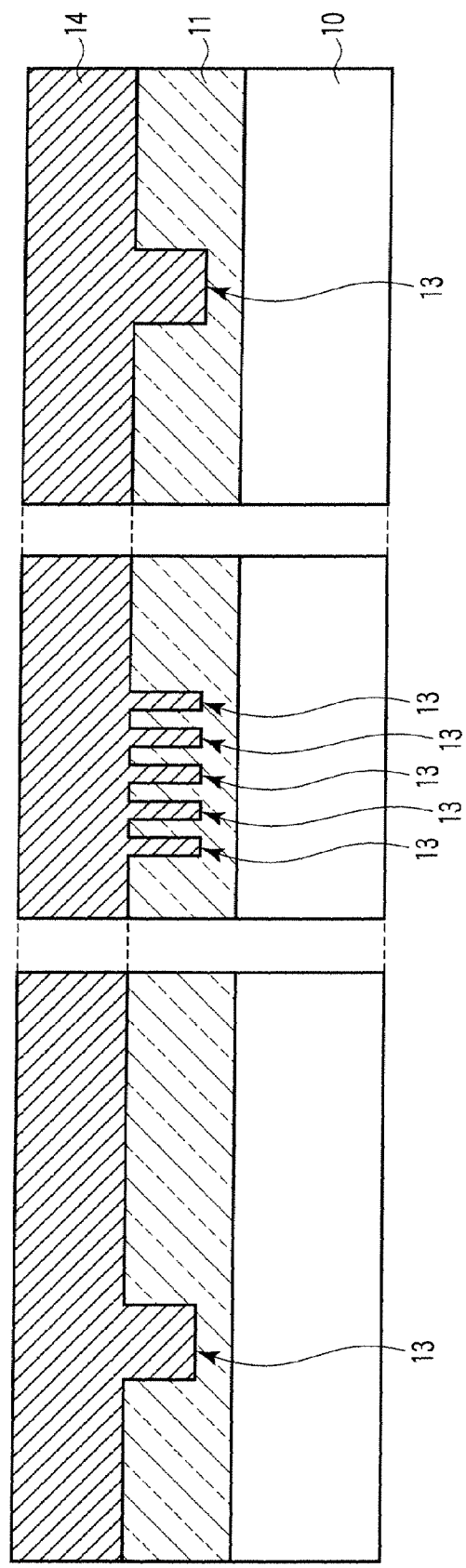
FIG. 17 is a sectional view in a step of the manufacturing method of the semiconductor device using the photomask according to the embodiment of the present invention.

Subsequently, as shown in FIG. 17, the first photoresist film 12 is removed. Then, a first conductive film 14 is formed on the first interlayer insulating film 11 to fill in the grooves 13. One example of the first conductive film 14 is a metal film. Examples of the metal film include a tungsten film, a copper film and an aluminum film.

Subsequently, as shown in FIG. 18, the surface of the first conductive film 14 is moved backward by chemically and mechanically polishing the surface of the first conductive film 14 by use of, for example, a CMP process to leave first conductors 14a in the grooves 13. In consequence, a first alignment mark 15-1, a first superimposition inspection mark 16-1 and a first device pattern 17-1 are formed above the semiconductor substrate 10, on an upper surface of the first interlayer insulating film 11 in the present example.

Figure 23:
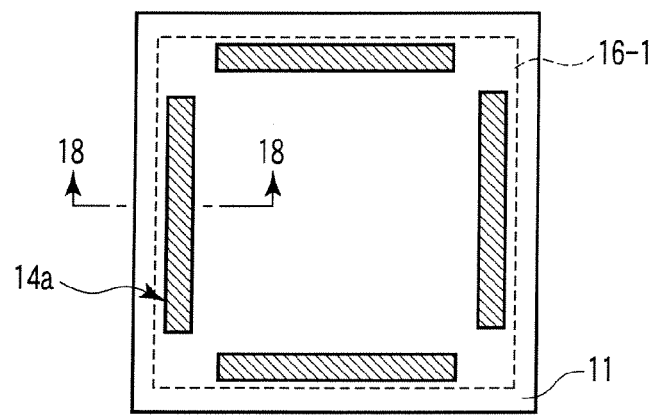
FIG. 23 is a plan view in a step of the manufacturing method of the semiconductor device using the photomask according to the embodiment of the present invention.

A plan view of the first superimposition inspection mark 16-1 in a stage shown in FIG. 18 is shown in FIG. 23. As shown in FIG. 23, the first superimposition inspection mark 16-1 is constituted of the first conductors 14a arranged along the four sides of a rectangle, along the four sides of a square in the present example on the upper surface of the first interlayer insulating film 11. Portions of the first superimposition inspection mark 16-1 corresponding to the main mark portions 5 only are formed on the upper surface of the first interlayer insulating film 11, and portions of the mark corresponding to the auxiliary pattern portions 6 are not formed because any image is not formed.

Figure 19:
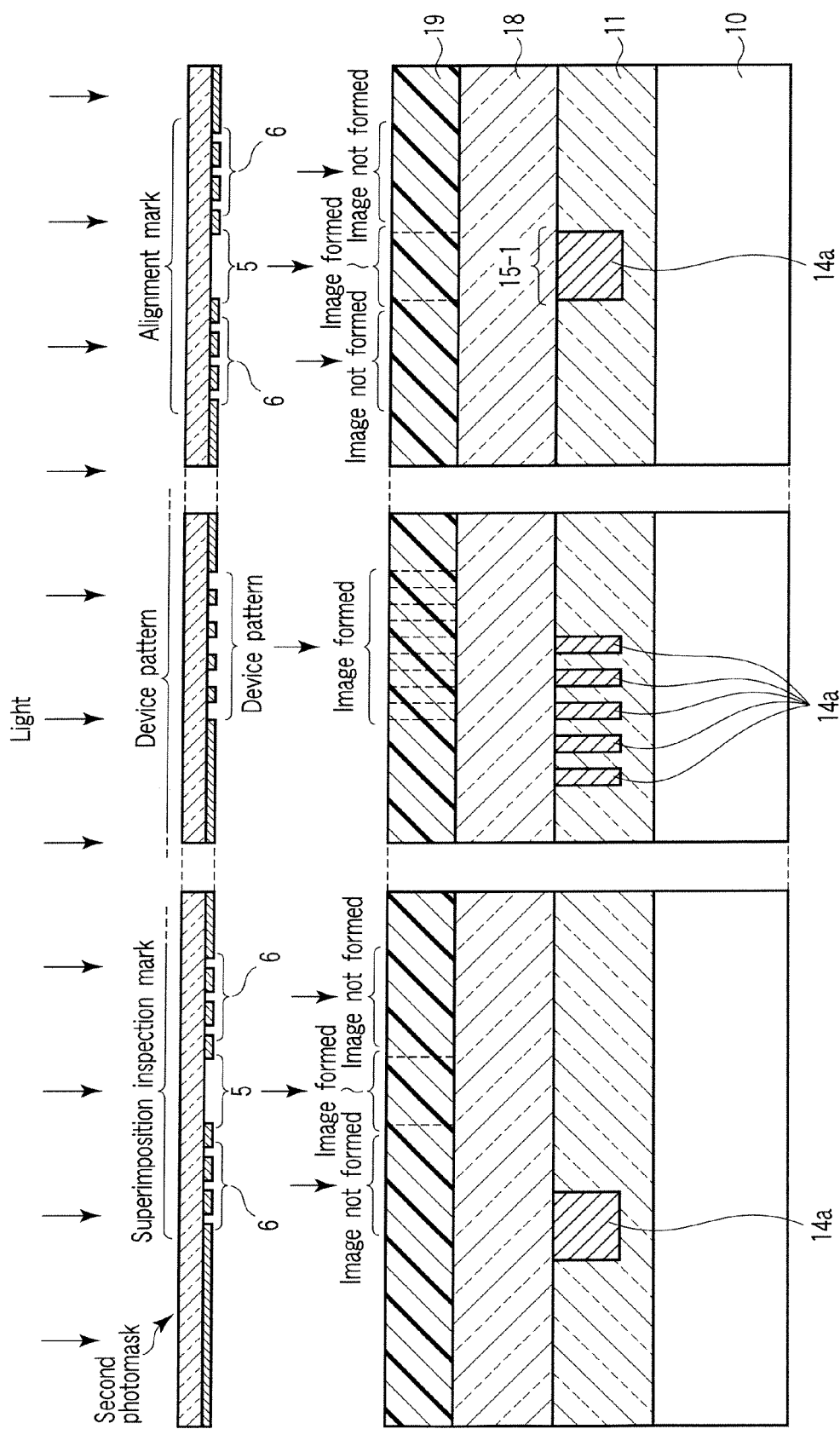
FIG. 19 is a sectional view in a step of the manufacturing method of the semiconductor device using the photomask according to the embodiment of the present invention.

Subsequently, as shown in FIG. 19, a second interlayer insulating film 18 is formed on the first interlayer insulating film 11. Then, a second photoresist film 19 is formed on the second interlayer insulating film 18. One example of the first photoresist film 12 is a positive photoresist film. Then, the second photomask shown in FIG. 12 is moved above the semiconductor substrate 10. At this time, the second photomask is aligned using the first alignment mark formed on the first interlayer insulating film 11. In this state, the second photoresist film 19 is irradiated with light via the second photomask to expose the second photoresist film 19. At this time, a device pattern and main mark portions 5 formed on the second photomask are formed into images on the second photoresist film 19, but auxiliary pattern portions 6 are not formed into any image on the second photoresist film 19.

Figure 20:
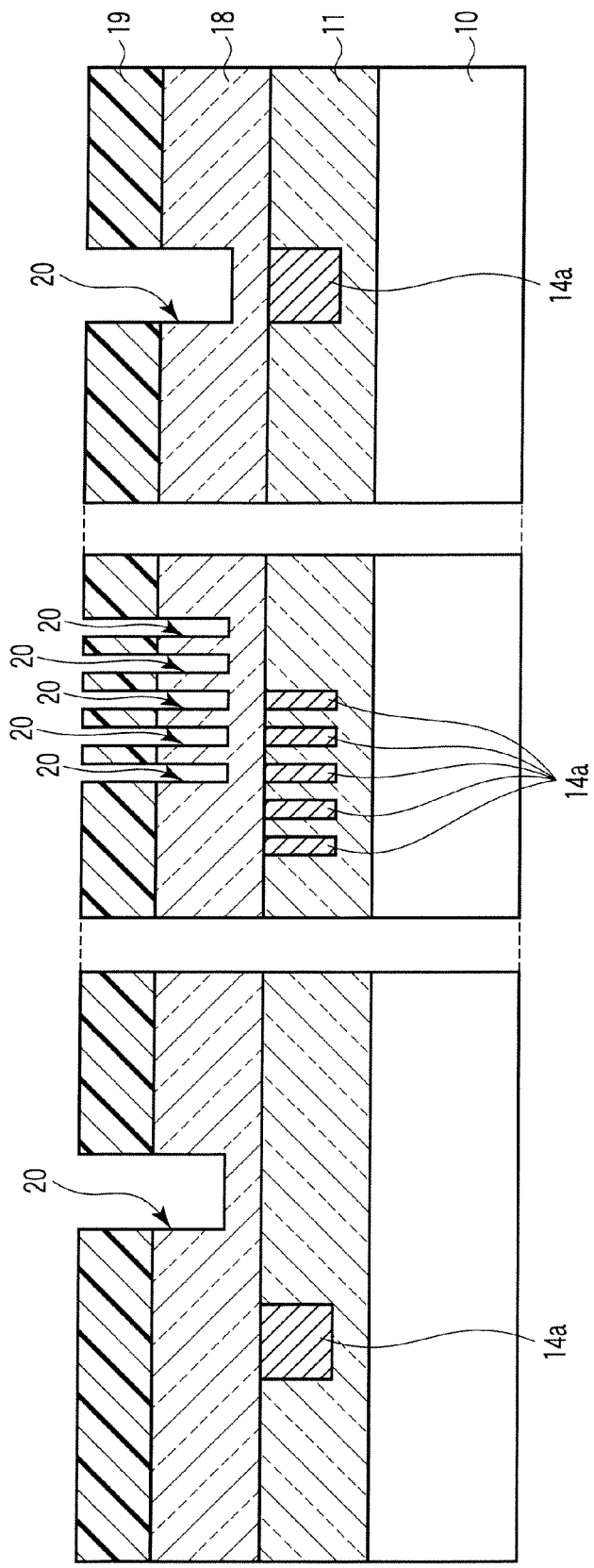
FIG. 20 is a sectional view in a step of the manufacturing method of the semiconductor device using the photomask according to the embodiment of the present invention.

Subsequently, as shown in FIG. 20, the second photoresist film 19 is developed. Then, the second interlayer insulating film 18 is etched using the developed second photoresist film 19 as a mask to form grooves 20 in the second interlayer insulating film 18. These grooves 20 are used as, for example, grooves for damascene wiring in a device pattern part.

Figure 21:
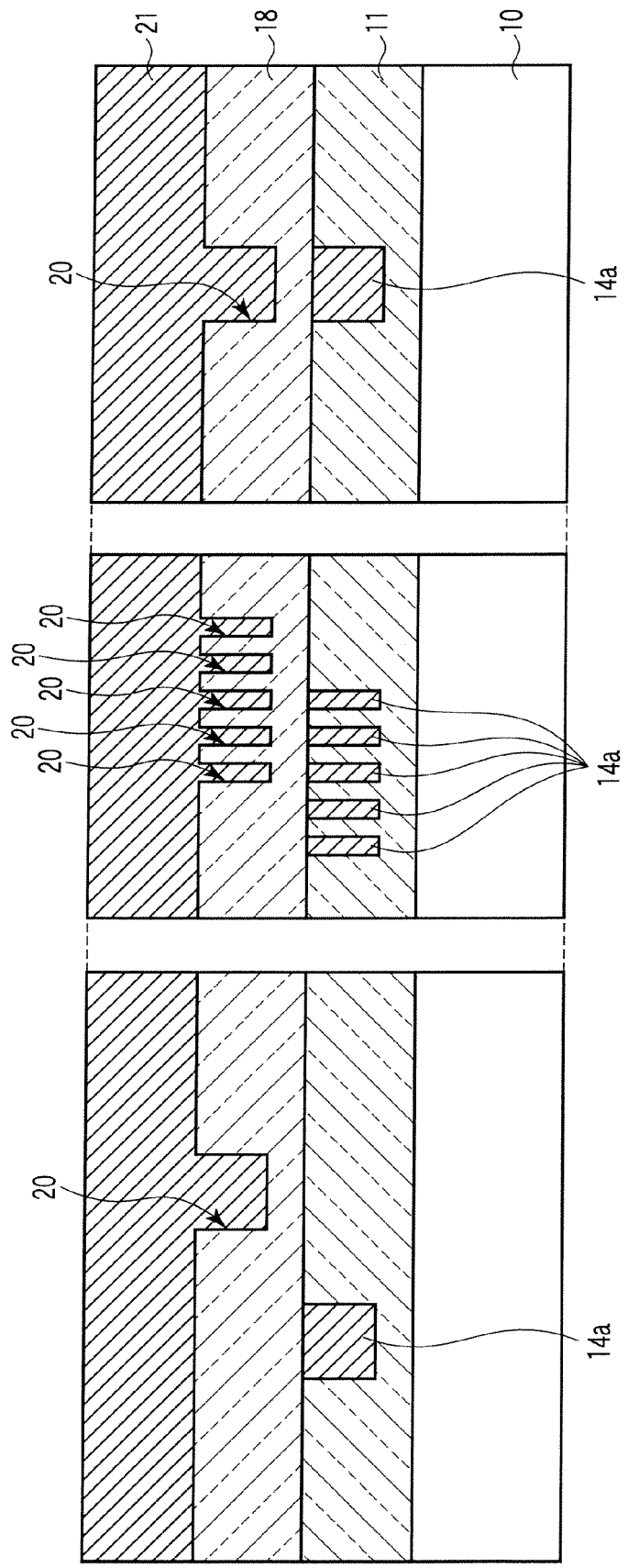
FIG. 21 is a sectional view in a step of the manufacturing method of the semiconductor device using the photomask according to the embodiment of the present invention.

Subsequently, as shown in FIG. 21, the second photoresist film 19 is removed. Then, a second conductive film 21 is formed on the second interlayer insulating film 18 to fill in the grooves 20. One example of the second conductive film 21 is a metal film. Examples of the metal film include a tungsten film, a copper film and an aluminum film.

Figure 22:
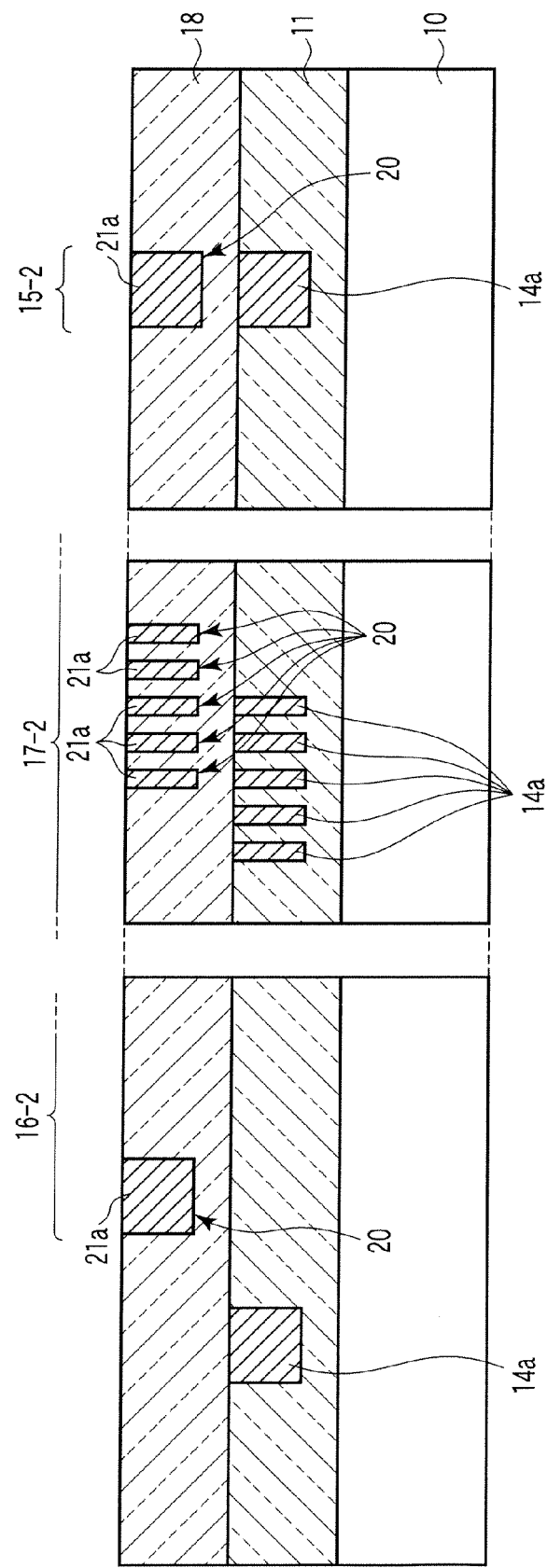
FIG. 22 is a sectional view in a step of the manufacturing method of the semiconductor device using the photomask according to the embodiment of the present invention.

Subsequently, as shown in FIG. 22, the surface of the second conductive film 21 is moved backward by chemically and mechanically polishing the surface of the second conductive film 21 by use of, for example, a CMP process to leave second conductors 21a in the grooves 20. In consequence, a second alignment mark 15-2, a second superimposition inspection mark 16-2 and a second device pattern 17-2 are formed above the semiconductor substrate 10, on an upper surface of the second interlayer insulating film 18 in the present example.

Figure 24:
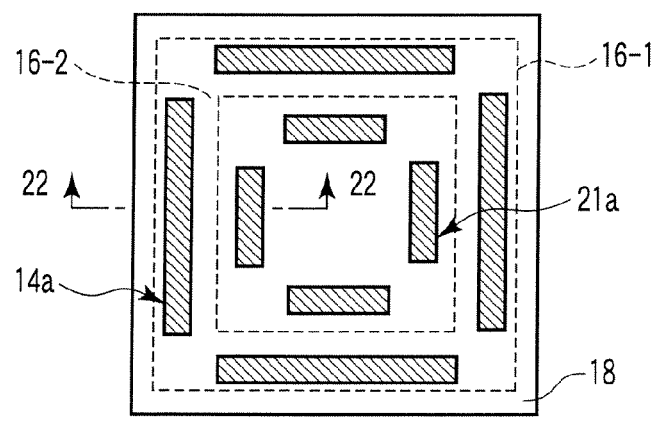
FIG. 24 is a plan view in a step of the manufacturing method of the semiconductor device using the photomask according to the embodiment of the present invention.

A plan view of the second superimposition inspection mark 16-2 in a stage shown in FIG. 22 is shown in FIG. 24. As shown in FIG. 24, the second superimposition inspection mark 16-2 is constituted of the second conductors 21a arranged along four sides of a rectangle, along four sides of a square in the present example on the upper surface of the second interlayer insulating film 18. Portions of the second superimposition inspection mark 16-2 corresponding to the main mark portions 5 only are formed on the upper surface of the second interlayer insulating film 18, and portions of the mark corresponding to the auxiliary pattern portions 6 are not formed because any image is not formed.

Figure 25:
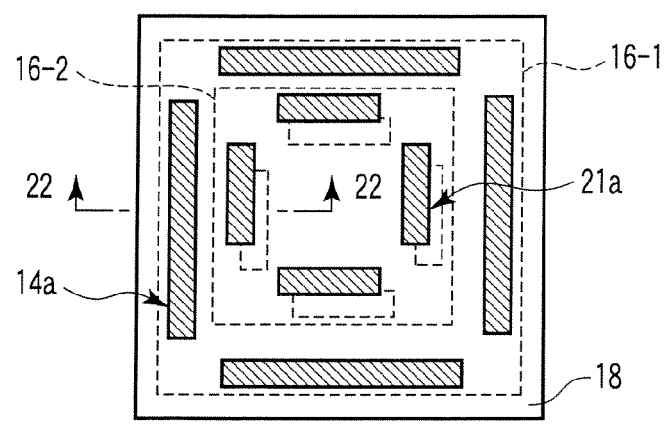
FIG. 25 is a plan view showing an evaluation example of superimposition.

The second superimposition inspection mark 16-2 is formed on an inner side of the first superimposition inspection mark 16-1 in the present example. Therefore, to inspect a superimposition precision, as shown in FIG. 25, a relative positional deviation between the superimposition inspection marks 16-1 and 16-2 is inspected to obtain this relative positional deviation. An exposure position in a lithography step in which the first and second photomasks are used is corrected using a result of the inspection, whereby highly precise superimposition can be realized.

The embodiment further includes the following configurations.

(1) A photomask including:

a light transmitting base having a light blocking film on one surface thereof;

a device pattern formed of a pattern of a light transmitting portion and a light blocking portion in accordance with the presence and absence of the light blocking film on the light transmitting base, to constitute a circuit pattern of a semiconductor integrated circuit device; and at least one of an alignment mark which is formed of a pattern of a light transmitting portion and a light blocking portion in accordance with the presence and absence of the light blocking film on the light transmitting base and which is utilized for alignment of the photomask during exposure, and a superimposition inspection mark which is formed of a pattern of a light transmitting portion and a light blocking portion in accordance with the presence and absence of the light blocking film on the light transmitting base and which is utilized for superimposition inspection to inspect whether or not the device pattern has been exposed at a correct position, wherein each of the alignment mark and the superimposition inspection mark includes a main mark portion, and first and second auxiliary pattern portions formed along two opposite side ends of the main mark portion, the main mark portion is constituted of one of a space pattern in which a hole is made through the light blocking film and a line pattern in which the light blocking film is left, the pattern having a linear width to be resolved on a photosensitive film formed on a semiconductor wafer, each of the first and second auxiliary pattern portions includes an auxiliary pattern constituted of one of a repeated pattern of a space pattern in which a hole is made through the light blocking film and a repeated pattern of a line pattern in which the light blocking film is left, the auxiliary pattern having a linear width not to be resolved on the photosensitive film, and the pitch of the repeated pattern is equal to the minimum pitch of the device pattern.

According to the photomask of configuration 1, above, the pitch of the repeated pattern constituting the auxiliary pattern is equal to the minimum pitch of the device pattern, so that the diffracted optical path produced by the alignment mark or the superimposition inspection mark including the auxiliary patterns is the same or substantially the same as the diffracted optical path produced by the device pattern. That is, the alignment mark or the superimposition inspection mark and the device pattern are equally or substantially equally influenced by an aberration of a projection lens. Therefore, the error between a transfer position of the alignment mark or the superimposition inspection mark and a transfer position of the device pattern is small as compared with the alignment mark or the superimposition inspection mark which does not have any auxiliary pattern. Therefore, an alignment error based on a deviation of the transfer position due to the aberration of the projection lens can be eliminated, and lowering of a superimposition inspection precision due to the deviation can be suppressed.

Furthermore, the auxiliary pattern has a linear width not to be resolved on the photosensitive film, so that an alignment error due to a measurement error produced by pattern asymmetry based on the aberration of the projection lens can be eliminated, and the lowering of the superimposition inspection precision due to the measurement error can be suppressed.

(2) In the photomask according to configuration 1, the main mark portion has a linear width substantially an integer multiple of the minimum pitch of the device pattern.

(3) In the photomask according to configuration 1, the auxiliary pattern has a linear width greater than $0.25\lambda/NA$, in which $\lambda$ is a wavelength of exposure light, and NA is the numeric aperture of an illumination apparatus.

(4) In the photomask according to configuration 1, when the linear width of the auxiliary pattern is $W_A$, the auxiliary pattern is repeated from a start position of $1.5W_A$ from a side end of the main mark portion, at such a pitch that a space $D_A$ between the auxiliary patterns is greater than the linear width $W_A$ of the auxiliary pattern.

(5) A superimposition correction method of a photomask, including:

preparing a first photomask including a first device pattern which becomes a circuit pattern of a semiconductor integrated circuit device, a first alignment mark constituted of the alignment mark according to any one of configurations 1 to 4, and a first superimposition inspection mark constituted of the superimposition inspection mark according to any one of configurations 1 to 4;

preparing a second photomask including a second device pattern which becomes a circuit pattern of the semiconductor integrated circuit device and which is superimposed on the first device pattern, and a second superimposition inspection mark constituted of the superimposition inspection mark according to any one of configurations 1 to 4;

forming, on a semiconductor wafer by use of the first photomask, a first in-wafer device pattern corresponding to the first device pattern, a first in-wafer alignment mark corresponding to the first alignment mark, and a first in-wafer superimposition inspection mark corresponding to the first superimposition inspection mark;

forming, on the semiconductor wafer, a second in-wafer device pattern corresponding to the second device pattern, and a second in-wafer superimposition inspection mark corresponding to the second superimposition inspection mark, in a state in which the second photomask is aligned on the semiconductor wafer by use of the first in-wafer alignment mark; and inspecting a relative positional deviation between the first in-wafer superimposition inspection mark and the second in-wafer superimposition inspection mark to correct, by use of a result of this inspection, an exposure position in a lithography step in which the first and second photomasks are used.

According to the superimposition correcting method of the photomask of configuration 5, above, the first and second in-wafer superimposition inspection marks are formed in the wafer by use of the first and second superimposition inspection marks constituted of the superimposition inspection mark according to any one of configurations 1 to 4. In the first and second in-wafer superimposition inspection marks, a transfer position error between the mark and the device pattern is reduced in first and second wafers. Therefore, the lowering of the superimposition inspection precision based on the deviation of the transfer position due to the aberration of the projection lens can be suppressed.

(6) A manufacturing method of a semiconductor device, including:

preparing a first photomask including a first device pattern which becomes a circuit pattern of a semiconductor integrated circuit device, a first alignment mark constituted of the alignment mark according to any one of configurations 1 to 4, and a first superimposition inspection mark constituted of the superimposition inspection mark according to any one of configurations 1 to 4;

preparing a second photomask including a second device pattern which becomes a circuit pattern of the semiconductor integrated circuit device and which is superimposed on the first device pattern, and a second superimposition inspection mark constituted of the superimposition inspection mark according to any one of configurations 1 to 4;

forming, on a semiconductor wafer by use of the first photomask, a first in-wafer device pattern corresponding to the first device pattern, a first in-wafer alignment mark corresponding to the first alignment mark, and a first in-wafer superimposition inspection mark corresponding to the first superimposition inspection mark; and forming, on the semiconductor wafer, a second in-wafer device pattern corresponding to the second device pattern, and a second in-wafer superimposition inspection mark corresponding to the second superimposition inspection mark, in a state in which the second photomask is aligned on the semiconductor wafer by use of the first in-wafer alignment mark.

According to the superimposition correction method of the photomask the manufacturing method of the semiconductor device of the above configuration 6, the first in-wafer alignment mark is formed using the first alignment mark constituted of the alignment mark according to any one of configurations 1 to 4, above, and the second photomask is aligned on the wafer by use of this first in-wafer alignment mark. The first in-wafer alignment mark has a reduced transfer position error between the mark and the first in-wafer device pattern, so that the lowering of the alignment precision based on the deviation of the transfer position due to the aberration of the projection lens can be suppressed.

Several embodiments of the present invention have been described above, but the present invention is not limited to the above embodiments, and can variously be modified within the scope of the invention, when the invention is carried out.

For example, the number of thin line-and-space patterns not to be resolved, that is, the auxiliary pattern portions is set to five. However, even if the number is greater or less than five, a similar effect can be obtained.

Moreover, the above embodiments include various stages of the invention, and various stages of the invention can be extracted in accordance with an appropriate combination of a plurality of constitutional requirements disclosed in the above embodiments.

What is claimed is:

1. A photomask comprising:
a light transmitting base having a light blocking film on one surface thereof;
a device pattern which is formed of a pattern of a light transmitting portion and a light blocking portion in accordance with the presence and absence of the light blocking film on the light transmitting base and which becomes a circuit pattern of a semiconductor integrated circuit device; and
at least one of an alignment mark which is formed of a pattern of a light transmitting portion and a light blocking portion in accordance with the presence and absence of the light blocking film on the light transmitting base and which is utilized for alignment of the photomask during exposure, and a superimposition inspection mark which is formed of a pattern of a light transmitting portion and a light blocking portion in accordance with the presence and absence of the light blocking film on the light transmitting base and which is utilized for superimposition inspection to inspect whether or not the device pattern has been exposed at a correct position,
wherein each of the alignment mark and the superimposition inspection mark includes a main mark portion, and first and second auxiliary pattern portions formed along two opposite side ends of the main mark portion,
the main mark portion is constituted of one of a space pattern in which a hole is made through the light blocking film and a line pattern in which the light blocking film is left, the pattern having a linear width to be resolved on a photosensitive film formed on a semiconductor wafer,
each of the first and second auxiliary pattern portions includes an auxiliary pattern, which is constituted of one of a repeated pattern of a space pattern in which a hole is made through the light blocking film and a repeated pattern of a line pattern in which the light blocking film is left, the repeated pattern having a linear width not to be resolved on the photosensitive film, and
a pitch of the repeated pattern is equal to a minimum pitch of the device pattern.

2. The photomask according to claim 1, wherein the main mark portion has a linear width which is an integer multiple of the minimum pitch of the device pattern.

3. The photomask according to claim 1, wherein the auxiliary pattern has a linear width less than $0.25\lambda/NA$, in which $\lambda$ is the wavelength of exposure light, and NA is the numeric aperture of an illumination apparatus.

4. The photomask according to claim 1, wherein when the linear width of the auxiliary pattern is $W_A$, the auxiliary pattern is repeated from a start position of $1.5W_A$ from a side end of the main mark portion, at such a pitch that a space $D_A$ between the auxiliary patterns is greater than the linear width $W_A$ of the auxiliary pattern.

5. The photomask according to claim 4, wherein a ratio $W_A:D_A$ between the linear width $W_A$ of the auxiliary pattern and the space $D_A$ between the auxiliary patterns is 1:4.

6. The photomask according to claim 1, wherein the superimposition inspection mark is constituted by arranging four marks each including the main mark portion and the auxiliary pattern portions along the four sides of a rectangle.

7. A superimposition correction method of a photomask, comprising:
preparing a first photomask including a first device pattern which becomes a circuit pattern of a semiconductor integrated circuit device, a first alignment mark constituted of the alignment mark according to claim 1, and a first superimposition inspection mark constituted of the superimposition inspection mark according to claim 1;
preparing a second photomask including a second device pattern which becomes a circuit pattern of the semiconductor integrated circuit device and which is superimposed on the first device pattern, and a second superimposition inspection mark constituted of the superimposition inspection mark according to claim 1;
forming, on a semiconductor wafer by use of the first photomask, a first in-wafer device pattern corresponding to the first device pattern, a first in-wafer alignment mark corresponding to the first alignment mark, and a first in-wafer superimposition inspection mark corresponding to the first superimposition inspection mark;
forming, on the semiconductor wafer, a second in-wafer device pattern corresponding to the second device pattern, and a second in-wafer superimposition inspection mark corresponding to the second superimposition inspection mark, in a state in which the second photomask is aligned on the semiconductor wafer by use of the first in-wafer alignment mark; and
inspecting a relative positional deviation between the first in-wafer superimposition inspection mark and the second in-wafer superimposition inspection mark to correct, by use of a result of this inspection, an exposure position in a lithography step in which the first and second photomasks are used.

8. The superimposition correcting method of the photomask according to claim 7, wherein the first superimposition inspection mark and the second superimposition inspection mark is different in size from each other.

9. The superimposition correcting method of the photomask according to claim 8, wherein the second superimposition inspection mark is smaller than the first superimposition inspection mark.

10. The superimposition correcting method of the photomask according to claim 9, wherein the second in-wafer superimposition inspection mark corresponding to the second superimposition inspection mark is transferred onto an inner side of the first in-wafer superimposition inspection mark corresponding to the first superimposition inspection mark.

11. The superimposition correcting method of the photomask according to claim 7, wherein the second photomask further includes a second alignment mark constituted of the alignment mark according to claim 1, and a second in-wafer alignment mark corresponding to the second alignment mark is formed on the semiconductor wafer by use of the second photomask, whereby the second photomask is aligned with respect to the semiconductor wafer by use of the first in-wafer alignment mark.

12. A manufacturing method of a semiconductor device, comprising:

preparing a first photomask including a first device pattern which becomes a circuit pattern of a semiconductor integrated circuit device, a first alignment mark constituted of the alignment mark according to claim 1, and a first superimposition inspection mark constituted of the superimposition inspection mark according to claim 1;

preparing a second photomask including a second device pattern which becomes a circuit pattern of the semiconductor integrated circuit device and which is superimposed on the first device pattern, and a second superimposition inspection mark constituted of the superimposition inspection mark according to claim 1;

forming, on a semiconductor wafer by use of the first photomask, a first in-wafer device pattern corresponding to the first device pattern, a first in-wafer alignment mark corresponding to the first alignment mark, and a first in-wafer superimposition inspection mark corresponding to the first superimposition inspection mark; and forming, on the semiconductor wafer, a second in-wafer device pattern corresponding to the second device pattern, and a second in-wafer superimposition inspection mark corresponding to the second superimposition inspection mark, in a state in which the second photomask is aligned on the semiconductor wafer by use of the first in-wafer alignment mark.

13. The manufacturing method of the semiconductor device according to claim 12, wherein the first superimposition inspection mark and the second superimposition inspection mark are different in size from each other.

14. The manufacturing method of the semiconductor device according to claim 13, wherein the second superimposition inspection mark is smaller than the first superimposition inspection mark.

15. The manufacturing method of the semiconductor device according to claim 14, wherein the second in-wafer superimposition inspection mark corresponding to the second superimposition inspection mark is transferred onto an inner side of the first in-wafer superimposition inspection mark corresponding to the first superimposition inspection mark.

16. The manufacturing method of the semiconductor device according to claim 12, wherein the second photomask further includes a second alignment mark constituted of the alignment mark according to claim 1, and a second in-wafer alignment mark corresponding to the second alignment mark is formed on the semiconductor wafer by use of the second photomask, whereby the second photomask is aligned with respect to the semiconductor wafer by use of the first in-wafer alignment mark.

* * * * *

UNITED STATES PATENT AND TRADEMARK OFFICE
CERTIFICATE OF CORRECTION

| | | |
|---|---|---|
| PATENT NO. | : 7,906,258 B2 | Page 1 of 1 |
| APPLICATION NO. | : 12/047516 | |
| DATED | : March 15, 2011 | |
| INVENTOR(S) | : Komine et al. | |

It is certified that error appears in the above-identified patent and that said Letters Patent is hereby corrected as shown below:

Claim 11, column 15, line 10, change "water" to --wafer--.

Claim 16, column 16, line 29, change "water" to --wafer--.

Signed and Sealed this
Seventh Day of June, 2011

David J. Kappos
*Director of the United States Patent and Trademark Office*